(12) United States Patent
Ashida

(10) Patent No.: US 10,818,478 B2
(45) Date of Patent: Oct. 27, 2020

(54) HIGH FREQUENCY GENERATOR AND PLASMA PROCESSING APPARATUS

(71) Applicant: TOKYO ELECTRON LIMITED, Tokyo (JP)

(72) Inventor: Mitsutoshi Ashida, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 303 days.

(21) Appl. No.: 15/914,951

(22) Filed: Mar. 7, 2018

(65) Prior Publication Data

US 2018/0261432 A1    Sep. 13, 2018

(30) Foreign Application Priority Data

Mar. 8, 2017   (JP) ................................. 2017-044180

(51) Int. Cl.
*H01J 37/32*          (2006.01)
(52) U.S. Cl.
CPC .... *H01J 37/32201* (2013.01); *H01J 37/3222* (2013.01); *H01J 37/32082* (2013.01); *H01J 37/32174* (2013.01); *H01J 37/32311* (2013.01)
(58) Field of Classification Search
CPC ........... H01J 37/32201; H01J 37/32174; H01J 37/32082; H01J 37/32311; H01J 37/3222; H01J 37/32192
See application file for complete search history.

(56) References Cited

U.S. PATENT DOCUMENTS

| 6,311,638 B1 | 11/2001 | Ishii et al. |
| 2004/0070347 A1 | 4/2004 | Nishida et al. |
| 2004/0082300 A1* | 4/2004 | Scheck ................. H03D 3/009 455/126 |

FOREIGN PATENT DOCUMENTS

| JP | 2000-299198 | 10/2000 |
| JP | 2002-164198 | 6/2002 |

* cited by examiner

*Primary Examiner* — Ram N Kackar
(74) *Attorney, Agent, or Firm* — Fenwick & West LLP

(57) ABSTRACT

In a high frequency generator, a high frequency generated by an IQ modulation of a vector multiplier and a amplification of an amplifier is outputted through an output unit. An directional coupler outputs a first high frequency including a part of traveling waves and a second high frequency including a part of reflected waves. A control units obtains an estimated value of each of an in-phase component and an orthogonal component of the traveling waves in the output unit, and an in-phase component and an orthogonal component of the reflected waves in the output unit by performing a first matrix operation that is an operation of four polynomials, each including as multi-variables an in-phase component and an orthogonal component of a first high frequency and an in-phase component and an orthogonal component of the second high frequency.

9 Claims, 7 Drawing Sheets

US 10,818,478 B2

HIGH FREQUENCY GENERATOR AND PLASMA PROCESSING APPARATUS

CROSS-REFERENCE TO RELATED APPLICATIONS

This application claims priority to Japanese Patent Application No. 2017-044180 filed on Mar. 8, 2017, the entire contents of which are incorporated herein by reference.

FIELD OF THE INVENTION

The present disclosure relates to a high frequency generator and a plasma processing apparatus.

BACKGROUND OF THE INVENTION

In manufacturing electronic devices, plasma processing may be performed on a target object. A plasma processing apparatus used for the plasma processing includes a chamber main body. An inner space of the chamber main body serves as a chamber. In the plasma processing apparatus, a high frequency (high frequency energy) is used for excitation of a gas in the chamber. Therefore, the plasma processing apparatus includes a high frequency generator. A high frequency generated by the high frequency generator may be, e.g., a microwave or a high frequency from LF band to VHF band.

The high frequency generator may be configured to control a power and a phase of a high frequency outputted from an output unit. This high frequency generator includes a directional coupler. The directional coupler outputs a first high frequency including a part of traveling waves propagating to the output unit and a second high frequency including a part of reflected waves returning to the output unit. The high frequency generator estimates a power and a phase of a high frequency to be outputted from the output unit based on the first and the second high frequency and controls a power and a phase of the outputted high frequency based on the estimated power and the estimated phase. The high frequency generator including the directional coupler is disclosed in Japanese Patent Application Publication Nos. 2000-299198 and 2002-164198.

The power and the phase which are estimated based on the first and the second high frequency include errors with respect to the power and the phase of the high frequency to be outputted from the output unit. Therefore, it is required to improve the accuracy in controlling the power and the phase of the high frequency.

SUMMARY OF THE INVENTION

In accordance with an aspect, there is provided a high frequency generator including a vector multiplier, an amplifier, a circulator, an output unit, a directional coupler and a control unit. The vector multiplier is configured to generate a modulated wave by applying IQ modulation to a high frequency original signal. The amplifier is configured to generate an amplified high frequency by amplifying the modulated wave and output the amplified high frequency. The circulator includes a first port, a second port and a third port and is configured to receive the amplified high frequency from the amplifier through the first port, allow a high frequency inputted into the first port to be outputted through the second port, and allow a high frequency inputted into the second port to be outputted through the third port. The output unit is an output unit of the high frequency generator and is connected to the second port. The directional coupler is configured to output a first high frequency including a part of traveling waves propagating from the amplifier to the output unit and output a second high frequency including a part of reflected waves returning to the output unit. The control unit is configured to determine a level of an in-phase signal and a level of an orthogonal signal that are used for the IQ modulation of the vector multiplier based on an in-phase component and an orthogonal component of the first high frequency and an in-phase component and an orthogonal component of the second high frequency.

The control unit is configured to obtain a first estimated value of an in-phase component of the traveling waves in the output unit, a second estimated value of an orthogonal component of the traveling waves in the output unit, a third estimated value of an in-phase component of the reflected waves in the output unit, and a fourth estimated value of an orthogonal component of the reflected waves in the output unit by performing a first matrix operation that is an operation of four polynomials, each including as multi-variables the in-phase component and the orthogonal component of the first high frequency and the in-phase component and the orthogonal component of the second high frequency. The control unit is configured to determine a level of the in-phase signal and a level of the orthogonal signal such that errors of an estimated power and an estimated phase of a high frequency in the output unit, which are obtained at least from the first estimated value and the second estimated value with respect to a target power and a target phase, are reduced. A matrix of coefficients used in the first matrix operation is predetermined such that the first estimated value, the second estimated value, the third estimated value and the fourth estimated value are obtained from the in-phase component and the orthogonal component of the first high frequency and the in-phase component and the orthogonal component of the second high frequency.

In accordance with another aspect, there is provided a plasma processing apparatus including a chamber main body providing a chamber; and the high frequency generator described above and configured to supply a high frequency to excite a gas supplied into the chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
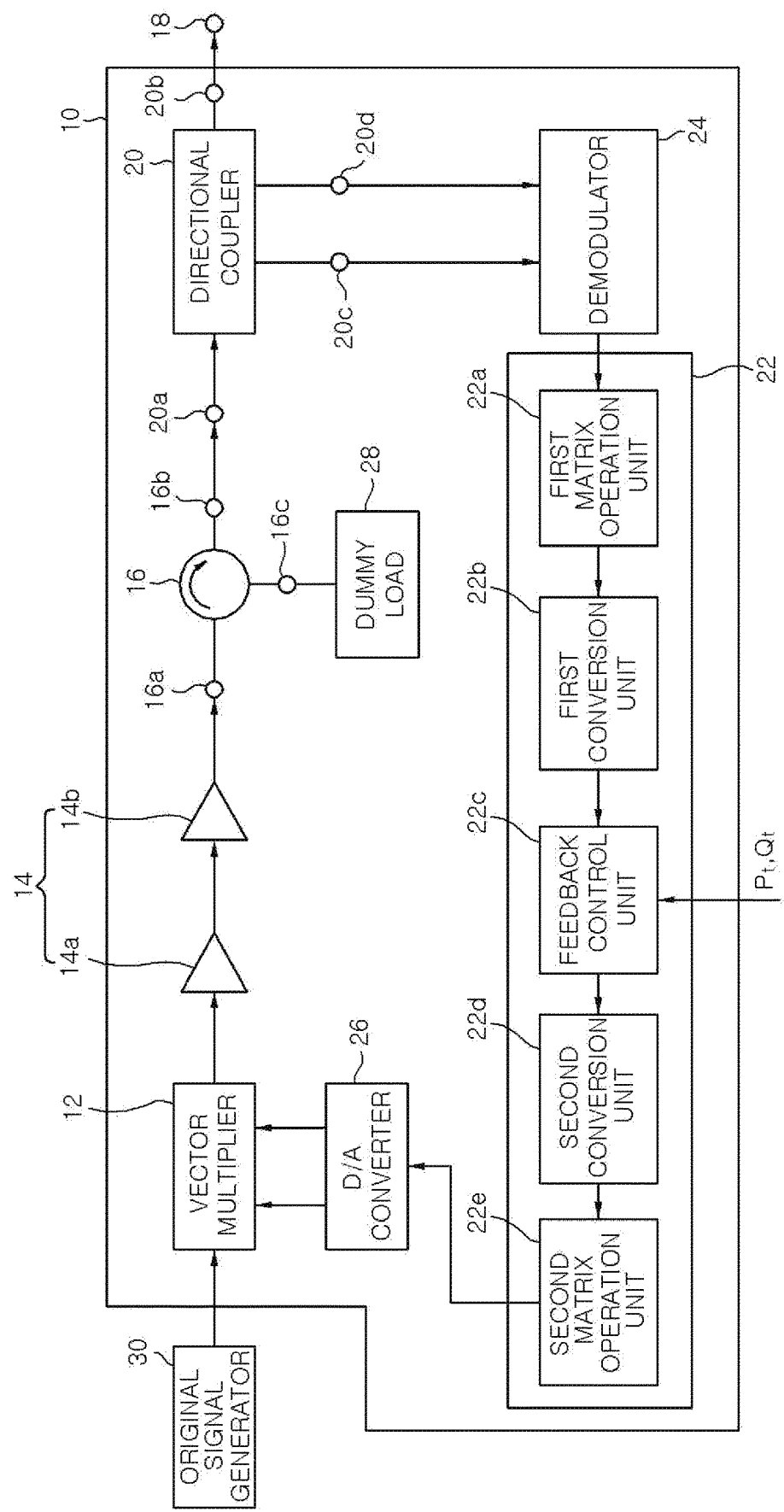
FIG. 1 shows a configuration of a high frequency generator according to an embodiment.

Hereinafter, embodiments will be described in detail with reference to the accompanying drawings. Like reference numerals will be given to like or corresponding parts throughout the drawings.

FIG. 1 shows a configuration of a high frequency generator according to an embodiment. A high frequency generator 10 shown in FIG. 1 is configured to generate a microwave as a high frequency and output the generated microwave. The high frequency generator 10 includes a vector multiplier 12, an amplifier 14, a circulator 16, an output unit 18, a directional coupler 20, and a control unit 22. The high frequency generator 10 further includes a demodulator 24, a D/A converter 26 and a dummy load 28.

Figure 2:
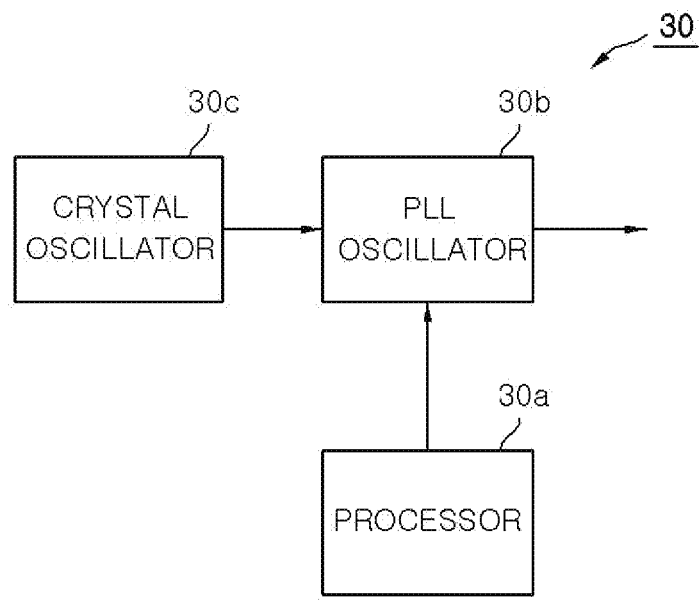
FIG. 2 shows an exemplary configuration of an original signal generator.

The vector multiplier 12 is connected to an original signal generator 30. The original signal generator 30 is configured to supply a high frequency original signal to the vector multiplier 12. FIG. 2 shows an exemplary configuration of the original signal generator. As shown in FIG. 2, the original signal generator 30 includes a processor 30a and a PLL (Phase Locked Loop) oscillator 30b. The processor 30a is, e.g., a microcomputer (MCU). The processor 30a is configured to specify a frequency of a high frequency original signal generated by the PLL oscillator 30b. A high frequency from a crystal oscillator 30c is supplied to the PLL oscillator 30b. The PLL oscillator 30b is configured to receive the high frequency from the crystal oscillator 30c and output the high frequency original signal having the frequency specified by the processor 30a. The high frequency generator 10 may have therein the original signal generator 30.

The original signal generator 30 may supply a high frequency original signal to a single high frequency generator 10, or may supply high frequency original signals to a plurality of high frequency generators 10. In a latter case, i.e., when the original signal generator 30 supplies high frequency original signals to a plurality of high frequency generators 10, the original signal generator 30 further includes a distributor. The high frequency original signal from the PLL oscillator 30b is inputted into the distributor. The distributor is configured to distribute the high frequency original signal to a plurality of high frequency generators 10.

Figure 3:
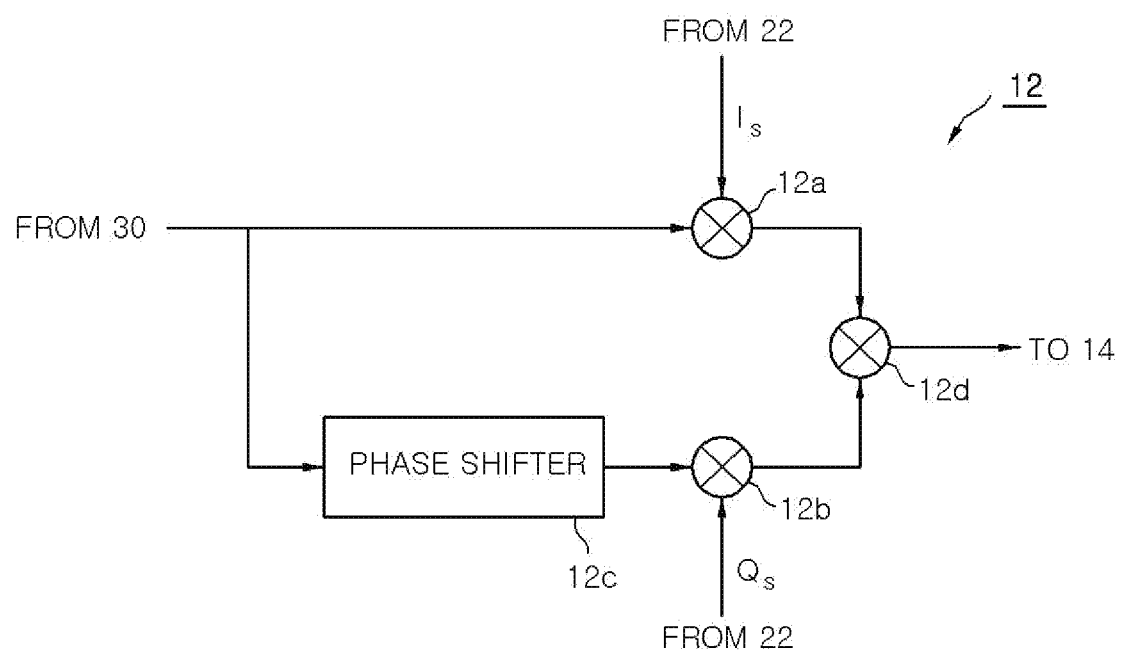
FIG. 3 shows an exemplary configuration of a vector multiplier.

FIG. 3 shows an exemplary configuration of the vector multiplier 12. The vector multiplier 12 includes mixers 12a and 12b, a phase shifter 12c and a combiner 12d. The vector multiplier 12 is configured to perform IQ modulation on the high frequency original signal by using an in-phase signal $I_S$ and an orthogonal signal $Q_S$ having levels determined by the control unit 22.

In the vector multiplier 12, the high frequency original signal from the original signal generator 30 is divided into two high frequency original signals. One of the two high frequency original signals is mixed with the in-phase signal $I_S$ by the mixer 12a. The mixer 12a outputs a high frequency obtained by multiplying one of the high frequency original signals and the in-phase signal $I_S$. The phase shifter 12c outputs a high frequency generated by shifting the phase of the other high frequency original signal by 90°. The high frequency outputted from the phase shifter 12c is mixed with the orthogonal signal $Q_S$ by the mixer 12b. The mixer 12b outputs a high frequency obtained by multiplying the high frequency from the phase shifter 12c and the orthogonal signal $Q_S$. The combiner 12d generates a modulated wave by combining (adding) the high frequency from the mixer 12a and the high frequency from the mixer 12b. The combiner 12d outputs the modulated wave thus generated.

Referring back to FIG. 1, the amplifier 14 is configured to receive the modulated wave from the vector multiplier 12 and amplify the received modulated wave. The amplifier 14 is configured to output an amplified high frequency generated by amplifying the modulated wave from the vector multiplier 12. In one example, the amplifier 14 includes a preamplifier 14a and a main amplifier 14b. In other words, the amplifier 14 is configured to generate an amplified high frequency by two-step amplification using two amplifiers.

The circulator 16 includes a first port 16a, a second port 16b and a third port 16c. The first port 16a is connected to an output of the amplifier 14. The circulator 16 allows the high frequency inputted from the outside into the first port 16a to be outputted through the second port 16b and allows the high frequency inputted from the outside into the second port 16b to be outputted through the third port 16c. The third port 16c is connected to a dummy load 28. The dummy load 28 receives the high frequency outputted from the third port 16c and absorbs the high frequency. The dummy load 28 can convert the high frequency into, e.g., heat.

The output unit 18 is a high frequency (e.g., microwave) output unit in the high frequency generator 10. In the example shown in FIG. 1, the output unit 18 is connected to the second port 16b of the circulator 16 via the directional coupler 20. The output unit 18 may be, e.g., a waveguide, when the high frequency outputted from the high frequency generator 10 is a microwave.

The directional coupler 20 includes a first port 20a, a second port 20b, a third port 20c and a fourth port 20d. The directional coupler 20 is configured to receive traveling waves propagating from the amplifier 14 to the output unit 18 through the first port 20a. In one embodiment, the first port 20a of the directional coupler 20 is connected to the second port 16b of the circulator 16. The directional coupler 20 is configured to output the traveling waves inputted into the first port 20a from the second port 20b. Further, the directional coupler 20 is configured to output from the third port 20c a first high frequency including a part of the traveling waves inputted into the first port 20a. Moreover, the directional coupler 20 is configured to receive the reflected waves returning to the output unit 18 through the second port 20b. In one embodiment, the second port 20b of the directional coupler 20 is connected to the output unit 18. The directional coupler 20 is configured to allow a second high frequency including a part of the reflected waves received through the second port 20b to be outputted through the fourth port 20d.

The directional coupler 20 may be provided to output the first high frequency between the amplifier 14 and the first port 16a of the circulator 16 and output the second high frequency between the third port 16c of the circulator 16 and the dummy load.

The control unit 22 is configured to determine levels of the in-phase signal $I_S$ and the orthogonal signal $Q_S$ used for the IQ modulation of the vector multiplier 12 based on an in-phase component $I_{MF}$ and an orthogonal component $Q_{MF}$ of the first high frequency and an in-phase component $I_{MR}$ and an orthogonal component $Q_{MR}$ of the second high frequency.

In one embodiment, the control unit 22 includes a first matrix operation unit 22a, a first conversion unit 22b, a feedback control unit 22c and a second conversion unit 22d. The control unit 22 may further include a second matrix operation unit 22e. The control unit 22 may be, e.g., a field programmable gate array or a processor. Or, each of the first matrix operation unit 22a, the first conversion unit 22b, the feedback control unit 22c, the second conversion unit 22d, and the second matrix operation unit 22e may be an individual electronic circuit or operator.

The first matrix operation unit 22a is connected to the third port 20c and the fourth port 20d of the directional coupler 20 via the demodulator 24. The demodulator 24 is configured to apply IQ demodulation on the first frequency and the second high frequency and generate the in-phase component $I_{MF}$ and the orthogonal component $Q_{MF}$ of the first high frequency and the in-phase component $I_{MR}$ and the orthogonal component $Q_{MR}$ of the second high frequency.

Figure 4:
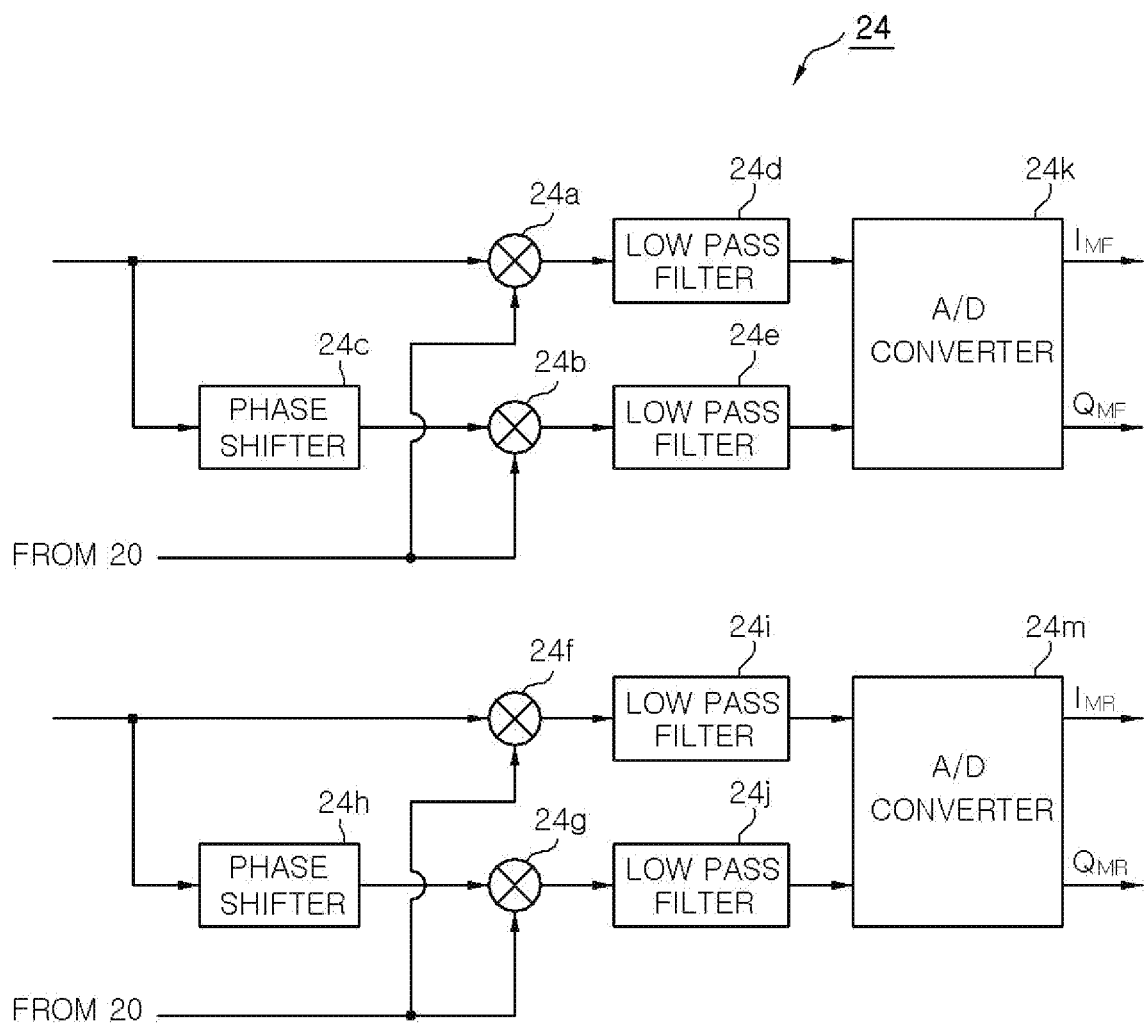
FIG. 4 shows an exemplary configuration of a demodulator.

FIG. 4 shows an exemplary configuration of the demodulator. As shown in FIG. 4, the demodulator 24 includes mixers 24a and 24b, a phase shifter 24c, low pass filters 24d and 24e, mixers 24f and 24g, a phase shifter 24h, low pass filters 24i and 24j, and A/D converters 24k and 24m.

The demodulator 24 receives the first high frequency from the third port 20c of the directional coupler and the second high frequency from the fourth port 20d of the directional coupler 20. In the demodulator 24, the first high frequency is divided into two first high frequencies. One of the two first high frequencies is mixed with a high frequency original signal by the mixer 24a. The mixer 24a outputs a signal obtained by multiplying one of the first high frequencies and the high frequency original signal. The high frequency original signal used in the demodulator 24 is supplied from the original signal generator 30. The high frequency component of the signal outputted from the mixer 24a is filtered by the low pass filter 24d. The low pass filter 24d outputs an in-phase component (analog signal) of the first high frequency which is generated by the filtering.

The phase shifter 24c outputs a high frequency generated by shifting the phase of the high frequency original signal by 90°. The high frequency outputted from the phase shifter 24c is mixed with the other first high frequency by the mixer 24b. The mixer 24b outputs a signal obtained by multiplying the high frequency from the phase shifter 24c and the other first high frequency. The high frequency components of the signal outputted from the mixer 24b are filtered by the low pass filter 24e. The low pass filter 24e outputs an orthogonal component (analog signal) of the first high frequency generated by the filtering.

In the demodulator 24, the second high frequency is divided into two second high frequencies. One of the two second high frequencies is mixed with the high frequency original signal by the mixer 24f. The mixer 24f outputs a signal obtained by multiplying one of the second high frequencies and the high frequency original signal. The component of the high frequency of the signal outputted from the mixer 24f is filtered by the low pass filter 24i. The low pass filter 24i outputs an in-phase component (analog signal) of the second high frequency generated by the filtering.

The phase shifter 24h outputs a high frequency generated by shifting the phase of the high frequency original signal by 90°. The high frequency outputted from the phase shifter 24h is mixed with the other second high frequency by the mixer 24g. The mixer 24g outputs a signal obtained by multiplying the high frequency from the phase shifter 24h and the other second high frequency. The high frequency component of the signal outputted from the mixer 24g is filtered by the low pass filter 24j. The low pass filter 24j outputs an orthogonal component (analog signal) of the second high frequency generated by the filtering.

The A/D converter 24k performs A/D conversion on the in-phase component (analog signal) of the first high frequency from the low pass filter 24d and the orthogonal component (analog signal) of the first high frequency from the low pass filter 24e. The A/D converter 24m performs A/D conversion on the in-phase component (analog signal) of the second high frequency from the low pass filter 24i and the orthogonal component (analog signal) of the second high frequency from the low pass filter 24j. Due to the A/D conversion of the A/D converters 24k and 24m, the in-phase component $I_{MF}$ and the orthogonal component $Q_{MF}$ of the first high frequency and the in-phase component $I_{MR}$ and the orthogonal component $Q_{MR}$ of the second high frequency of the second high frequency are generated as digital signals. As shown in FIG. 1, the A/D converters 24k and 24m are connected to the control unit 22. The in-phase component $I_{MF}$ and the orthogonal component $Q_{MF}$ of the first high frequency are inputted from the A/D converter 24k into the control unit 22. The in-phase component $I_{MR}$ and the orthogonal component $Q_{MR}$ of the second high frequency are inputted from the A/D converter 24m into the control unit 22.

The first matrix operation unit 22a of the control unit 22 performs first matrix operation. The first matrix operation is an operation of four polynomials. The first matrix operation unit 22a is configured to obtain a first estimated value $I_{E1}$ of the in-phase component of the traveling waves in the output unit 18, a second estimated value $Q_{E2}$ of the orthogonal component of the traveling waves in the output unit, a third estimated value $I_{E3}$ of the in-phase component of the reflected waves in the output unit and a fourth estimated value $Q_{E4}$ of the orthogonal component of the reflected waves in the output unit by performing the first matrix operation.

Each of the four polynomials includes, as multi-variables, the in-phase component $I_{MF}$ and the orthogonal component $Q_{MF}$ of the first high frequency and the in-phase component $I_{MR}$ and the orthogonal component $Q_{MR}$ of the second high frequency. One or more matrices of coefficients used in the first matrix operation are predetermined such that the first estimated value $I_{E1}$, the second estimated value $Q_{E2}$, the third estimated value $I_{E3}$ and the fourth estimated value $Q_{E4}$ are obtained from the in-phase component $I_{MF}$, the orthogonal component $Q_{MF}$, the in-phase component $I_{MR}$ and the orthogonal component $Q_{MR}$.

The following Eq. (1) shows the first matrix operation. In Eq. (1), $A_j$ is a matrix of 4 rows and 4 columns of coefficients; $B_k$ is a matrix of 4 rows and 4 columns of coefficients; and C is a matrix of 4 rows and 1 column of coefficients. In Eq. (1), j and k are integers greater than or equal to 1. In other words, a right side of the equation of the first matrix operation includes one or more matrices of coefficients.

$$\begin{pmatrix} I_{E1} \\ Q_{E2} \\ I_{E3} \\ Q_{E4} \end{pmatrix} = \sum_j A_j \begin{pmatrix} I_{MF}^j \\ Q_{MF}^j \\ I_{MR}^j \\ Q_{MR}^j \end{pmatrix} + \sum_k B_k \begin{pmatrix} f_{1\_k}(I_{MF}, Q_{MF}) \\ f_{2\_k}(I_{MF}, Q_{MF}) \\ f_{3\_k}(I_{MR}, Q_{MR}) \\ f_{4\_k}(I_{MR}, Q_{MR}) \end{pmatrix} + C \quad \text{Eq. (1)}$$

Eq. (1) is a generalized equation. In the first matrix operation, an operation of a pre-selected equation is performed based on Eq. (1) such that the first estimated value $I_{E1}$, the second estimated value $Q_{E2}$, the third estimated value $I_{E3}$ and the fourth estimated value $Q_{E4}$ are optimally estimated from the in-phase component $I_{MF}$, the orthogonal component $Q_{MF}$, the in-phase component $I_{MR}$ and the orthogonal component $Q_{MR}$. The first matrix operation includes at least an operation of the first term of the right side of Eq. (1). The first matrix operation may include, as the operation of the first term of the right side of Eq. (1), an operation of a first term of the in-phase component $I_{MF}$, the orthogonal component $Q_{MF}$, the in-phase component $I_{MR}$ and the orthogonal component $Q_{MR}$ and one or more operations of high-order terms. In one example, the first matrix operation may include, as the operation of the first term of the right side of Eq. (1), an operation of a first term, an operation of a third term and an operation of a fifth term of the in-phase component $I_{MF}$, the orthogonal component $Q_{MF}$, the in-phase component $I_{MR}$, and the orthogonal component $Q_{MR}$.

The first matrix operation may further include at least one of the operations between a second term and a third term of the right side of Eq. (1). In the second term, $f_{1\_k}(I_{MF}, Q_{MF})$ may be a function including a product of $I_{MF}$ or exponentiation thereof and $Q_{MF}$ or exponentiation thereof, and $f_{2\_k}(I_{MF}, Q_{MF})$ may be a function including a quotient of $I_{MF}$ or exponentiation thereof and $Q_{MF}$ or exponentiation thereof. In addition, in the second term, $f_{3\_k}(I_{MR}, Q_{MR})$ may be a function including a product of $I_{MR}$ or exponentiation thereof and $Q_{MR}$ or exponentiation thereof, and $f_{4\_k}(I_{MF}, Q_{MF})$ may be a function including a quotient of $I_{MF}$ or exponentiation thereof and $Q_{MF}$ or exponentiation thereof.

The first conversion unit 22b calculates an estimated value $P_{EF}$ of the power and an estimated value $\theta_{EF}$ of the phase of the traveling waves in the output unit 18 from the first estimated value $I_{E1}$ and the second estimated value $Q_{E2}$. The first conversion unit 22b may further calculate an estimated value $P_{ER}$ of the power and an estimated value $\theta_{ER}$ of the phase of the reflected waves in the output unit 18 from the third estimated value $I_{E3}$ and the fourth estimated value $Q_{E4}$. The calculations in the first conversion unit 22b are defined by the following Eqs. (2a) to (2d).

$$P_{EF} = I_{E1}^2 + Q_{E2}^2 \quad \text{Eq. (2a)}$$

$$\theta_{EF} = \tan^{-1}(Q_{E2}/I_{E1}) \quad \text{Eq. (2b)}$$

$$P_{ER} = I_{E3}^2 + Q_{E4}^2 \quad \text{Eq. (2c)}$$

$$\theta_{ER} = \tan^{-1}(Q_{E4}/I_{E3}) \quad \text{Eq. (2d)}$$

The feedback control unit 22c calculates a corrected power $P_C$ and a corrected phase $\theta_C$ such that errors of the estimated power and the estimated phase of the high frequency in the output unit 18 which are obtained from the first estimated value $I_{E1}$ and the second estimated value $Q_{E2}$ with respect to a target power $P_t$ and a target phase $\theta_t$ are reduced. In one embodiment, the feedback control unit 22c may use the estimated power $P_{EF}$ and the estimated phase $e_{EF}$ as the estimated power and the estimated phase of the high frequency in the output unit 18. Or, the feedback control unit 22c may use a power obtained by subtracting the estimated power $P_{EF}$ from the estimated power $P_{EF}$ as the estimated power of the high frequency in the output unit 18 and may use the estimated phase $\theta_{EF}$ as the estimated phase of the high frequency in the output unit 18. The feedback control unit 22c can calculate the corrected power $P_C$ and the corrected phase $\theta_C$ by, e.g., PID control.

The second conversion unit 22d converts the corrected power $P_C$ and the corrected phase $\theta_C$ into an in-phase component $I_1$ and an orthogonal component $Q_1$ on an IQ plane which correspond thereto. In this conversion, the original signal having the same frequency as that of the high frequency original signal is used. In one embodiment, the in-phase component $I_1$ and the orthogonal component $Q_1$ are used as an in-phase component $I_C$ and an orthogonal component $Q_C$ for determining a level of an in-phase signal $I_S$ and a level of an orthogonal signal $Q_S$, respectively. In another embodiment, the second matrix operation unit 22e calculates an in-phase component $I_2$ (second in-phase component) and an orthogonal component $Q_2$ (second orthogonal component) from the in-phase component $I_2$ (first in-phase component) and the orthogonal component $Q_2$ (first orthogonal component). The in-phase component $I_2$ and the orthogonal component $Q_2$ are used as an in-phase component $I_C$ and an orthogonal component $Q_C$ for determining a level of an in-phase signal $I_S$ and a level of an orthogonal signal $Q_S$, respectively.

The second matrix operation unit 22e calculates the in-phase component $I_2$ and the orthogonal component $Q_2$ by performing a second matrix operation. The second matrix operation is an operation of two polynomials, each including the in-phase component $I_2$ and the orthogonal component $Q_2$ as multi-variables. The matrix of coefficients used in the second matrix operation is predetermined such that errors of the power and the phase of the high frequency in the output unit 18 with respect to a target power and a target phase are reduced.

The following Eq. (3) shows the second matrix operation. In Eq. (3), $D_m$ is a matrix of 2 rows and 2 columns of coefficients; $E_n$ is a matrix of 2 rows and 2 columns of coefficients; and H is a matrix of 2 rows and 1 column of coefficients. In Eq. (3), m and n are integers greater than or equal to 1. In other words, the right side of the equation of the second matrix operation includes one or more matrices of coefficients.

$$\begin{pmatrix} I_2 \\ Q_2 \end{pmatrix} = \sum_m D_m \begin{pmatrix} I_1^m \\ Q_1^m \end{pmatrix} + \sum_m E_n \begin{pmatrix} g_{1\_n}(I_1, Q_1) \\ g_{2\_n}(I_1, Q_1) \end{pmatrix} + H \quad \text{Eq. (3)}$$

Eq. (3) is a generalized equation. In the second matrix operation, an operation of a pre-selected equation is performed based on Eq. (3) such that the in-phase component $I_2$ and the orthogonal component $Q_2$ are optimally estimated from the in-phase component $I_1$ and the orthogonal component $Q_1$. The second matrix operation includes at least an operation of the first term of the right side of Eq. (3). The second matrix operation may include, as the operation of the first term of the right side of Eq. (3), an operation of a first term of the in-phase component $I_1$ and the orthogonal component $Q_1$ and one or more operations of high-order terms. In one example, the second matrix operation may include, as the operation of the first term of the right side of Eq. (3), an operation of a first term, an operation of a third term and an operation of a fifth term of the in-phase component $I_1$ and the orthogonal component $Q_1$.

The second matrix operation may further include at least one of the operations between the second term and the third term of the right side of Eq. (3). In the second term, $g_{1\_n}(I_1, Q_1)$ may be a function including a product of $I_1$ or exponentiation thereof and $Q_1$ or exponentiationa power thereof, and $g_{2\_n}(I_1, Q_1)$ may be a function including a quotient of $I_1$ or exponentiation thereof and $Q_1$ or exponentiation thereof.

The second matrix operation unit 22e is connected to the D/A converter 26. The D/A converter 26 generates an analog in-phase signal $I_S$ and an analog orthogonal signal $Q_S$ by performing D/A conversion on the in-phase component $I_C$ and the orthogonal component $Q_C$. The level of the in-phase signal $I_S$ is determined by the in-phase component $I_C$. The level of the orthogonal signal $Q_S$ is determined by the orthogonal component $Q_C$.

The first high frequency outputted from the directional coupler 20 includes a part of the reflected waves as well as a part of the traveling waves. The second high frequency outputted from the directional coupler 20 includes a part of the traveling waves as well as a part of the reflected waves. In other words, the directional coupler 20 cannot completely separate the travelling waves and the reflected waves. Each of the above-mentioned four polynomials includes as multivariables the in-phase component $I_{MF}$ and the orthogonal component $Q_{MF}$ of the first high frequency and the in-phase component $I_{MR}$ and the orthogonal component $Q_{MR}$ of the second high frequency. Therefore, as a result of the first matrix operation that is an operation of four polynomials, the first estimated value $I_{E1}$, the second estimated value $Q_{E2}$, the third estimated value $I_{E3}$ and the fourth estimated value $Q_{E4}$ are obtained while correcting the effect of interference of the reflected waves in the first high frequency and the effect of interference of the traveling waves in the second high frequency. Accordingly, the first to the fourth estimated value having small errors with respect to the in-phase component and the orthogonal component of the traveling waves in the output unit and those of the reflected waves in the output unit 18 are obtained. In the high frequency generator 10, the level of the in-phase signal $I_S$ and the level of the orthogonal signal $Q_S$ which are used for the IQ modulation of the vector multiplier 12 are determined based on the first to the fourth estimated value and, thus, the accuracy in controlling the power and the phase of the high frequency to be outputted is increased.

In one embodiment, the first matrix operation includes operations of high-order terms of the in-phase component $I_{MF}$ and the orthogonal component $Q_{MF}$ of the first high frequency and the in-phase component $I_{MR}$ and the orthogonal component $Q_{MR}$ of the second high frequency. Accordingly, the first to the fourth estimated value are obtained with a higher accuracy.

When the high frequency propagates from the vector multiplier 12 to the output unit 18, the power and the phase of the high frequency may be changed. In one embodiment, as a result of the second matrix operation, the in-phase component $I_2$ and the orthogonal component $Q_2$ are obtained to correct the changes in the power and the phase of the high frequency between the vector multiplier 12 and the output unit 18. Since the level of the in-phase signal $I_S$ and the level of the orthogonal signal $Q_S$ which are used for the IQ modulation in the vector multiplier 12 are determined from the in-phase component $I_2$ and the orthogonal component $Q_2$, respectively, the accuracy in controlling the power and the phase of the high frequency to be outputted is further increased.

The high frequency outputted from the vector multiplier 12 interferes at a certain ratio with the high frequency inputted into the vector multiplier 12. The phase of the high frequency is changed between the first port 15a and the second port 16b of the circulator 16. The amount of change in the phase of the high frequency in the circulator 16 depends on the power of the high frequency. The changes in the high frequency between the vector multiplier 12 and the second port 16b of the circulator 16 can be expressed as high-order interference. By setting the level of the in-phase signal $I_S$ and the level of the orthogonal signal $Q_S$ which are applied to the vector multiplier 12 based on the high-order interference, a high frequency (traveling wave) with a power and a phase having smaller errors with respect to a desired power and a desired phase is obtained in the output unit 18. In one embodiment, the second matrix operation includes operations of high-order terms of the in-phase component $I_1$ and the orthogonal component $Q_1$. In this embodiment, since the level of the in-phase signal $I_S$ and the level of the orthogonal signal $Q_S$ are respectively set by the in-phase component $I_2$ and the orthogonal component $Q_2$ which are obtained by the second matrix operation, the accuracy in controlling the power and the phase of the high frequency to be outputted with respect to a desired power and a desired phase is further increased.

The high frequency generator 10 can perform high-speed control of the power and/or the phase of the high frequency to be supplied to a load without controlling a mechanical component such as a motor. Therefore, the high frequency generator 10 can be used as a high frequency generation source when it is required to perform the high-speed control of the power and/or the phase of the high frequency. In such a case, there may be used a plasma processing apparatus for performing an atomic layer deposition process, a plasma processing apparatus requiring accurate power control before plasma ignition, or a processing apparatus for performing processing without using a plasma (e.g., a direct heating apparatus using a microwave).

Hereinafter, a method for previously obtaining a matrix of coefficients used in the first matrix operation will be described. The matrix of coefficients used in the first matrix operation is experimentally obtained. As described above, the first matrix operation is generalized as Eq. (1). As for an equation that is actually used in the first matrix operation, an equation suitable for estimating an in-phase component and an orthogonal component of the traveling waves in the output unit 18 and an in-phase component and an orthogonal component of the reflected waves in the output unit 18 from the in-phase component $I_{MF}$, the orthogonal component $Q_{MF}$, the in-phase component $I_{MR}$ and the orthogonal component $Q_{MR}$ is pre-selected among the equations generalized as Eq. (1).

Figure 5:
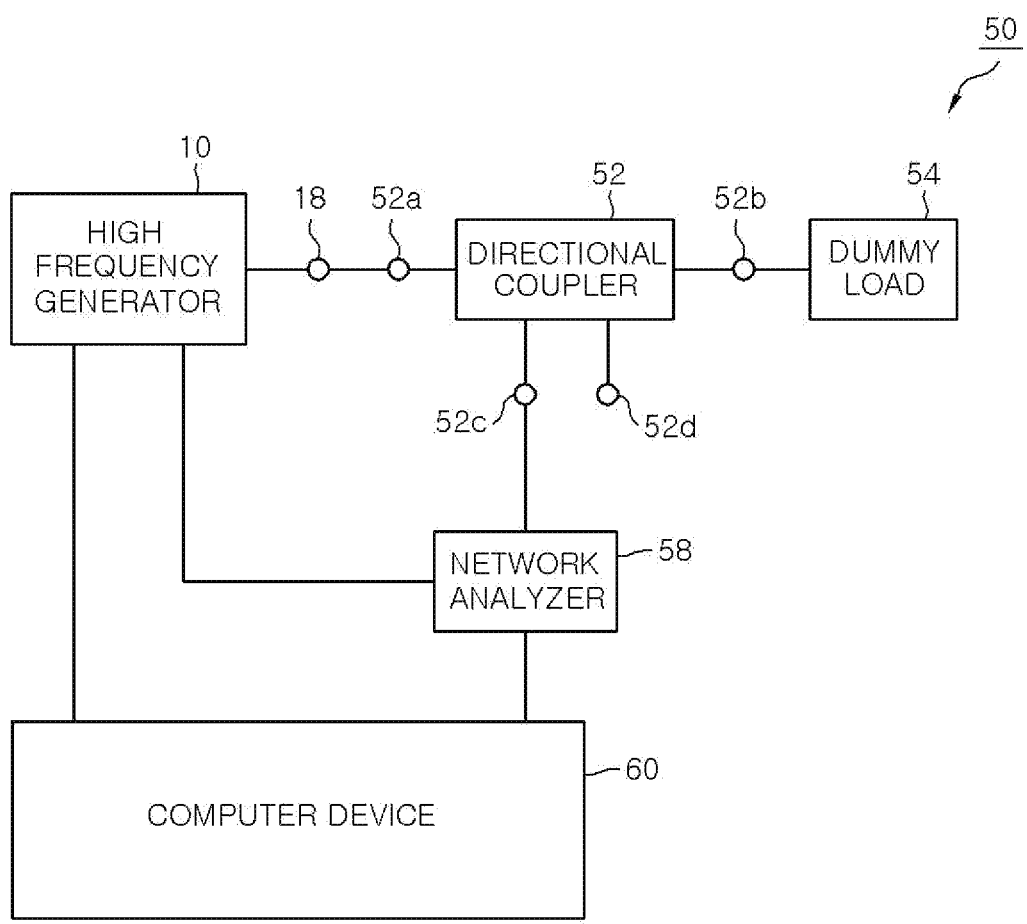
FIGS. 5 and 6 show examples of a system for experimentally obtaining a matrix of coefficients used in a first matrix operation.
Figure 6:
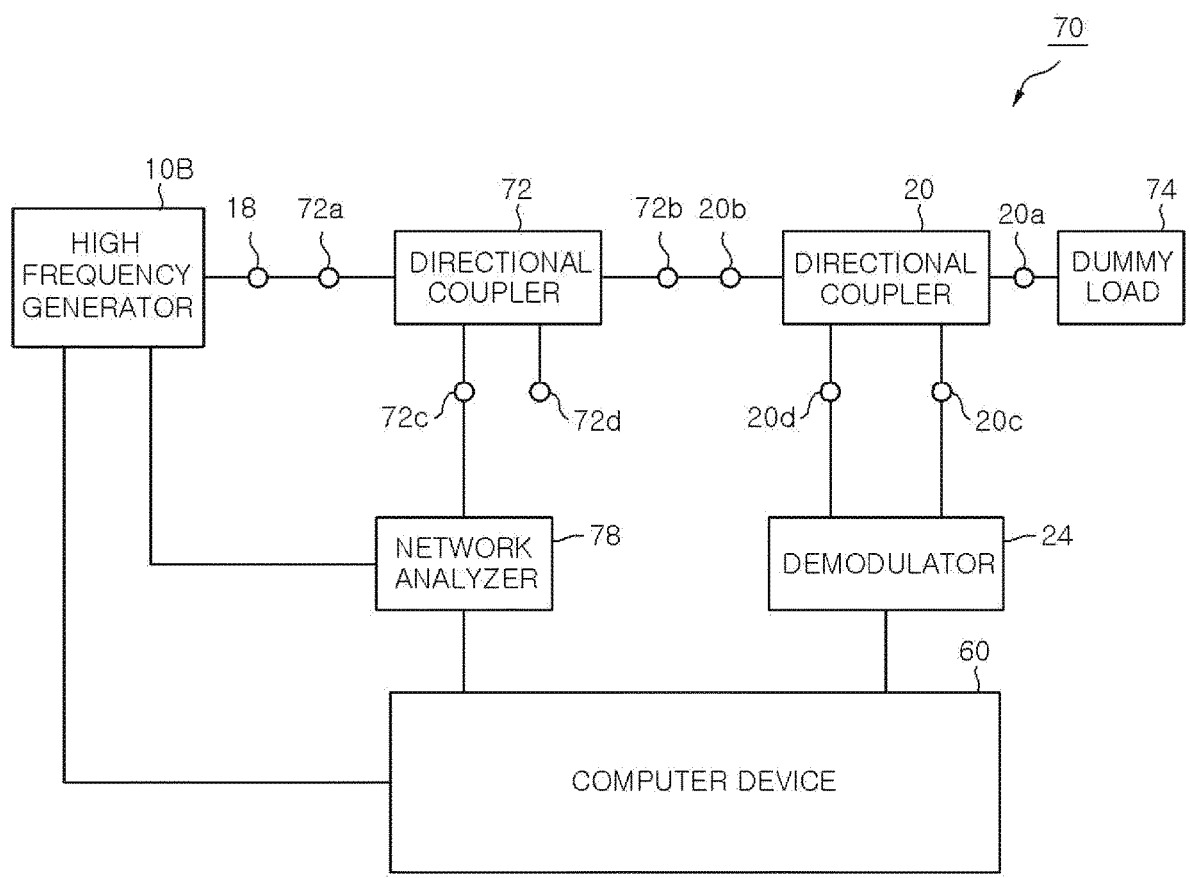

FIGS. 5 and 6 show examples of a system for experimentally obtaining a matrix of coefficients used in the first matrix operation. A system 50 shown in FIG. 5 includes a high frequency generator 10, a directional coupler 52, a dummy load 54, a network analyzer 58 and a computer device 60.

The directional coupler 52 has a first port 52a, a second port 52b, a third port 52c and a fourth port 52d. The directional coupler 52 is configured to allow a high frequency inputted from the outside into the first port 52a to be outputted through the second port 52b, allow a high frequency including a part of the high frequency propagating from the first port 52a to the second port 52b to be outputted through the third port 52c, and allow a high frequency including a part of the high frequency inputted from the outside into the second port 52b to be outputted to the fourth port 52d. The first port 52a of the directional coupler 52 is connected to the output unit 18 of the high frequency generator 10. The second port 52b of the directional coupler 52 is connected to the dummy load 54. The dummy load 54 is configured to absorb the high frequency outputted from the second port 52b. Therefore, the system is configured to prevent the reflected waves from returning to the second port 52b.

The third port 52c of the directional coupler 52 is connected to the network analyzer 58. The network analyzer 58 is connected to the computer device 60 to detect a power and a phase of the high frequency outputted from the third port 52c of the directional coupler 52 and output the detected power and the detected phase to the computer device 60. The computer device 60 is connected to the demodulator 24 to receive the in-phase component $I_{MF}$ and the orthogonal component $Q_{MF}$ of the first high frequency and the in-phase component $I_{MR}$ and the orthogonal component $Q_{MR}$ of the second high frequency from the demodulator 24 of the high frequency generator 10.

The computer device 60 is connected, instead of the control unit 22, to the high frequency generator 10 to apply the in-phase signal $I_S$ and the orthogonal signal $Q_S$ to the vector multiplier 12. Further, the computer device 60 is configured to receive the power and the phase of the high frequency outputted from the third port 52c of the directional coupler 52 from the network analyzer 58 and obtain an in-phase component $I_{M1}$ and an orthogonal component $Q_{M1}$ of the high frequency having the corresponding power and the corresponding phase.

A system 70 shown in FIG. 6 includes a high frequency generator 10B. The high frequency generator 10B is the same as the high frequency generator 10. The system 70 further includes a directional coupler 20, a directional coupler 72, a dummy load 74, a demodulator 24, a network analyzer 78 and a computer device 60.

The directional coupler 72 has a first port 72a, a second port 72b, a third port 72c and a fourth port 72d. The directional coupler 72 is configured to allow the high frequency inputted from the outside into the first port 72a to be outputted through the second port 72b, allow a high frequency including a part of the high frequency propagating from the first port 72a to the second port 72b to be outputted through the third port 72c, and allows a high frequency including a part of the high frequency inputted from the outside into the second port 72b to be outputted to the fourth port 72d. The first port 72a of the directional coupler 72 is connected to the output unit 18 of the high frequency generator 10B.

The directional coupler 20 is the same as the directional coupler 20 of the high frequency generator 10. In the system 70, the second port 20b of the directional coupler 20 is connected to the second port 72b of the directional coupler 72. The first port 20a of the directional coupler 20 is connected to the dummy load 74. The dummy load 74 is configured to absorb the high frequency outputted from the first port 20a. Therefore, the system 70 is configured to prevent the reflected waves from returning to the first port 20a.

The demodulator 24 is the same as the demodulator 24 of the high frequency generator 10. The demodulator 24 is configured to obtain the in-phase component $I_{MF}$ and the orthogonal component $Q_{MF}$ of the high frequency outputted from the third port 20c of the directional coupler 20. Further, the demodulator 24 is configured to obtain the in-phase component $I_{MR}$ and the orthogonal component $Q_{MR}$ of the high frequency outputted from the fourth port 20d of the directional coupler 20. The demodulator 24 is connected to the computer device 60 to output the in-phase component $I_{MF}$ and the orthogonal component $Q_{MF}$, and the in-phase component $I_{MR}$ and the orthogonal component $Q_{MR}$ to the computer device 60.

The network analyzer 78 is connected, instead of the original signal generator 30, to the high frequency generator 10B to supply the high frequency original signal to the vector multiplier 12 of the high frequency generator 10B. The network analyzer 78 is connected to the computer device 60 to detect a power and a phase of the high frequency outputted from the third port 72c of the directional coupler 72 and output the detected power and the detected phase to the computer device 60.

In the system 70, the computer device 60 is connected, instead of the control unit 22, to the high frequency generator 10B to apply the in-phase signal $I_S$ and the orthogonal signal $Q_S$ to the vector multiplier 12. Further, the computer device 60 is configured to receive the power and the phase of the high frequency outputted from the third port 72c of the directional coupler 72 from the network analyzer 78 and obtain an in-phase component $I_{M2}$ and an orthogonal component $Q_{M2}$ of the high frequency having the corresponding power and the corresponding phase.

In the case of experimentally obtaining a matrix of coefficients used in the first matrix operation, the high frequency original signal is supplied from the network analyzer 58 to the vector multiplier 12 of the high frequency generator 10. Further, the in-phase signal $I_S$ and the orthogonal signal $Q_S$ are supplied from the computer device 60 to the vector multiplier 12 of the high frequency generator 10. The in-phase component $I_{MF}$ and the orthogonal component $Q_{MF}$ of the first high frequency and the in-phase component $I_{MR}$ and the orthogonal component $Q_{MR}$ of the second high frequency are obtained from the demodulator 24 of the high frequency generator 10 by the computer device 60. The power and the phase of the high frequency outputted from the third port 52c of the directional coupler 52 are detected by the network analyzer 58, and the in-phase component $I_{M1}$ and the orthogonal component $Q_{M1}$ of the high frequency having the detected power and the detected phase are obtained by the computer device 60. By performing these processes by using a plurality of sets of the in-phase signals $I_S$ having different levels and the orthogonal signals $Q_S$ having different levels, a plurality of first data sets, each including ($I_{MF}$, $Q_{MF}$, $I_{MR}$, $Q_{MR}$) and ($I_{M1}$, $Q_{M1}$, 0, 0) corresponding thereto, is obtained.

The high frequency original signal is supplied from the network analyzer 78 of the system 70 to the vector multiplier 12 of the high frequency generator 10B. Further, the in-phase signal $I_S$ and the orthogonal signal $Q_S$ are supplied from the computer device 60 to the vector multiplier 12 of the high frequency generator 10B. The in-phase component $I_{MF}$ and the orthogonal component $Q_{MF}$, and the in-phase component $I_{MR}$ and the orthogonal component $Q_{MR}$ are obtained from the demodulator 24 of the system 70 by the computer device 60. The power and the phase of the high frequency outputted from the third port 72c of the directional coupler 72 are detected by the network analyzer 78, and the in-phase component $I_{M2}$ and the orthogonal component $Q_{M2}$ of the high frequency having the detected power and the detected phase are obtained by the computer device 60. By performing these processes by using a plurality of sets of the in-phase signals $I_S$ having different levels and the orthogonal signals $Q_S$ having different levels, a plurality of first data sets, each including ($I_{MF}$, $Q_{MF}$, $Q_{MR}$, $Q_{MR}$) and (0, 0, $I_{M2}$, $Q_{M2}$) corresponding thereto, is obtained.

Components of one or more matrices of coefficients used in the first matrix operation are obtained by the computer device 60 such that a distance between ($I_{E1}$, $Q_{E2}$, $I_{E3}$, $Q_{E4}$) and ($I_{M1}$, $Q_{M1}$, 0, 0) corresponding thereto which are obtained by using ($I_{MF}$, $Q_{MF}$, $I^{MR}$, $Q_{MR}$) of each of the plurality of first data sets as multi-variables of the first matrix operation and a distance between ($I_{E1}$, $Q_{E2}$, $I_{E3}$, $Q_{E4}$) and (0, 0, $I_{M2}$, $Q_{M2}$) corresponding thereto which are obtained by using ($I_{MF}$, $Q_{MF}$, $I^{MR}$, $Q_{MR}$) of each of the plurality of second data sets as multi-variables of the first matrix operation can be minimized. A method for obtaining components of one or more matrices of coefficients may be, e.g., a method of least squares. The obtained one or more matrices of coefficients are stored in a storage device such as a memory of the control unit 22 and used in the first matrix operation in the control unit 22.

Hereinafter, a method for previously obtaining a matrix of coefficients used in the second matrix operation will be described. The matrix of coefficients used in the second matrix operation is experimentally obtained. As described above, the second matrix operation is generalized as Eq. (3). As for an equation that is actually used in the second matrix operation, an equation for converting the in-phase component $I_2$ and the orthogonal component $Q_2$ to the in-phase component $I_2$ and the orthogonal component $Q_2$ to obtain a high frequency having a desired power and a desired phase in the output unit 18 is pre-selected among the equations generalized as Eq. (3).

Figure 7:
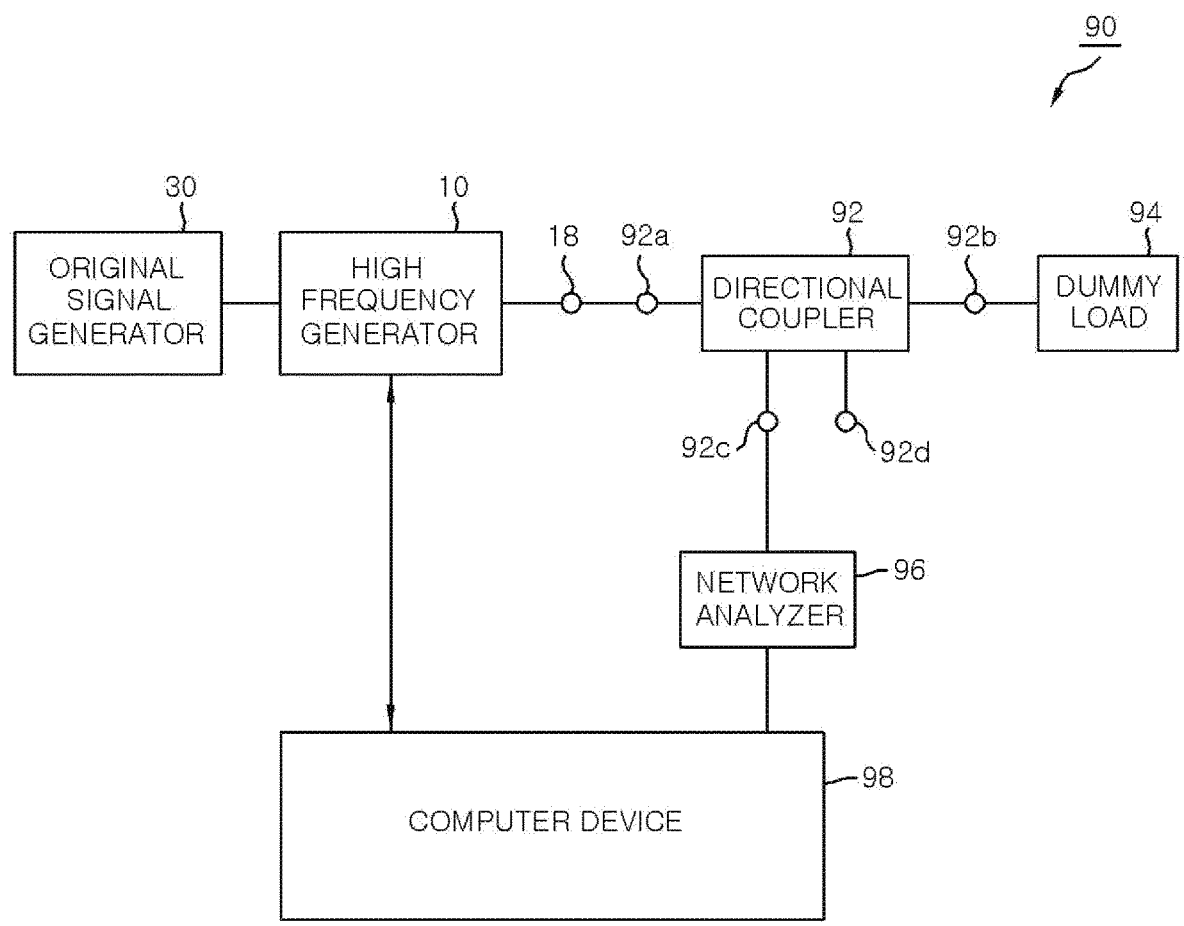
FIG. 7 shows an example of a system for experimentally obtaining a matrix of coefficients used in a second matrix operation.

FIG. 7 shows an example of the system for experimentally obtaining a matrix of coefficients used in the second matrix operation. In order to obtain the matrix of the coefficients used in the second matrix operation, a system 90 shown in FIG. 7 is used, for example. The system includes a high frequency generator 10, a directional coupler 92, a dummy load 94, a network analyzer 96, and a computer device 98.

The directional coupler 92 has a first port 92a, a second port 92b, a third port 92c and a fourth port 92d. The first port 92a is connected to the output unit 18 of the high frequency generator 10. The directional coupler 92 is configured to allow a high frequency inputted from the outside into the first port 92a to be outputted through the second port 92b, allow a high frequency including a part of the high frequency propagating from the first port 92a to the second port 92b to be outputted through the third port 92c, and allow a high frequency including a part of the high frequency inputted from the outside into the second port 92b to be outputted to the fourth port 92d. The second port 92b is connected to the dummy load 94. The dummy load 94 is configured to absorb the high frequency from the second port 92b.

The third port 92c of the directional coupler 92 is connected to the network analyzer 96. The network analyzer 96 is connected to the computer device 98 to output a power and a phase of the high frequency from the third port 92c of the directional coupler 92.

The computer device 98 is configured to supply the in-phase signal $I_S$ and the orthogonal signal $Q_S$ to the vector multiplier 12 of the high frequency generator 10. The computer device 98 is configured to receive the power and the phase of the high frequency outputted from the third port 92c of the directional coupler 92 from the network analyzer 96 and obtain an in-phase component $I_d$ and an orthogonal component $Q_d$ of the traveling waves in the output unit 18 from the corresponding power and the corresponding phase.

In the case of experimentally determining the matrix of coefficients used in the first matrix operation, the high frequency original signal is supplied from the original signal generator 30 to the vector multiplier 12 of the high frequency generator 10. Further, the in-phase signal $I_S$ and the orthogonal signal $Q_S$ are supplied from the computer device 98 to the vector multiplier 12 of the high frequency generator 10. The level of the in-phase signal $I_S$ is determined by the in-phase component $I_{2a}$ and the level of the orthogonal signal $Q_S$ is determined by the orthogonal component $Q_{2a}$. The in-phase component $I_d$ and the orthogonal component $Q_d$ are obtained by the computer device 98. Next, a length of the vector ($I_d$, $Q_d$) from the origin on the IQ plane is reduced by using an amplification factor of the amplifier 14 as a reduction rate by the computer device 98. Accordingly, an in-phase component $I_{1a}$ and an orthogonal component $Q_{1a}$ are obtained from the in-phase component $I_d$ and the orthogonal component $Q_d$. By performing these processes by using a plurality of sets of the in-phase signals $I_S$ having different levels and the orthogonal signals $Q_S$ having different levels, a plurality of third data sets, each including ($I_{2a}$, $Q_{2a}$) and ($I_{1a}$, $Q_{1a}$) corresponding thereto, is obtained.

Next, components of one or more matrices of coefficients used in the second matrix operation are obtained by the computer device 98 such that a distance between ($I_2$, $Q_2$) and ($I_{2a}$, $Q_{2a}$) corresponding thereto which are obtained by using ($I_{1a}$, $Q_{1a}$) of each of the plurality of third data sets as multi-variables of the second matrix operation can be minimized. A method for obtaining components of one or more matrices of coefficients may be, e.g., a method of least squares. The obtained one or more matrices of coefficients are stored in a storage device such as a memory of the control unit 22 and used in the second matrix operation in the control unit 22.

Figure 8:
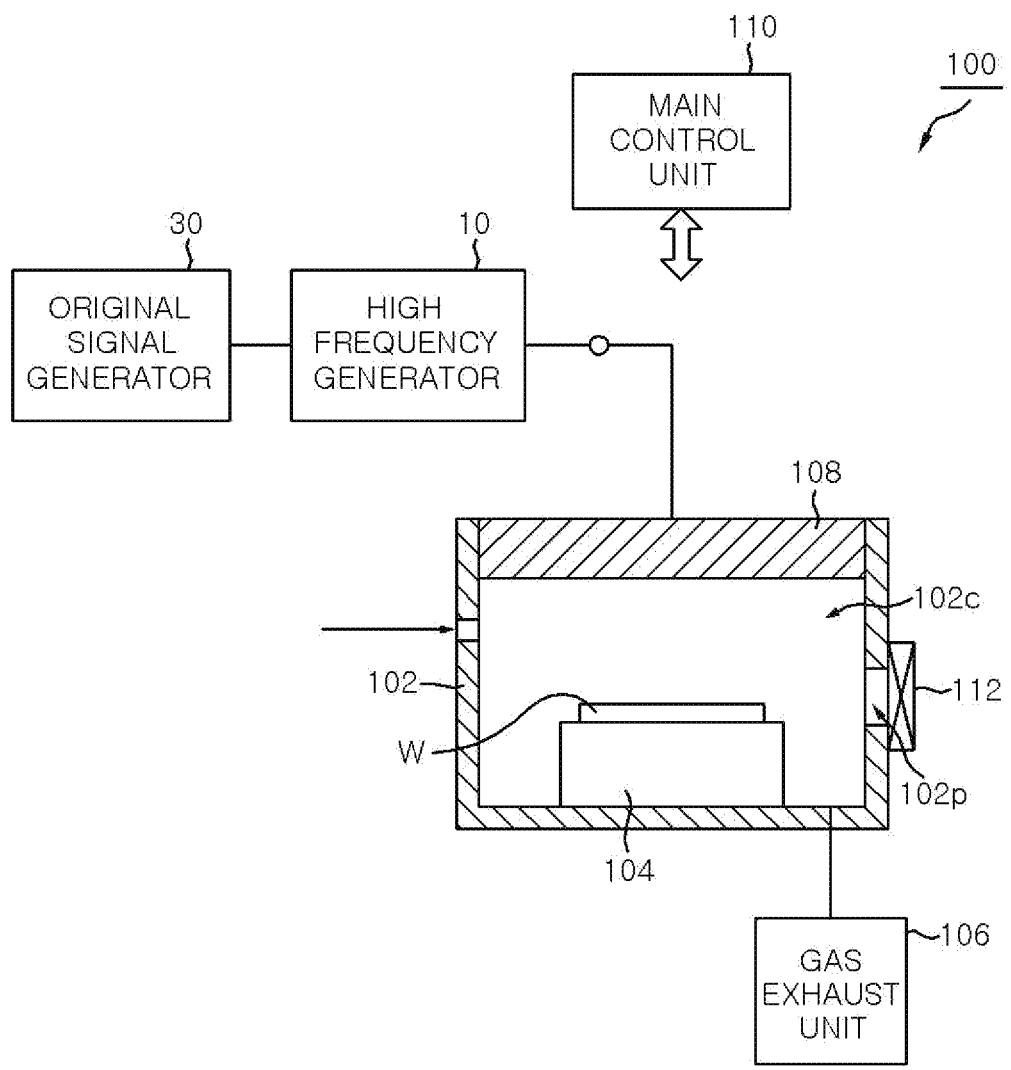
FIG. 8 shows a plasma processing apparatus according to an embodiment.

Hereinafter, an embodiment of a plasma processing apparatus including the high frequency generator 10 will be described. FIG. 8 is a schematic view showing a plasma processing apparatus according to an embodiment. The plasma processing apparatus shown in FIG. 8 includes a high frequency generator 10, a chamber main body 102, a stage 104, a gas exhaust unit 106, an antenna 108, and a main control unit 110.

An inner space of the chamber main body 102 is defined as a chamber 102c. A stage 104 is provided in the chamber 102c. The stage 104 is configured to hold thereon a target object W. An opening 102p is formed at a sidewall of the chamber main body 102. The target object W is loaded into the chamber 102c from the outside of the chamber main body 102 or unloaded from the chamber 102c to the outside of the chamber main body 102 through the opening 102p. A gate valve 112 for opening/closing the opening 102p is provided at the sidewall of the chamber main body 102.

The gas exhaust unit 106 is connected to the chamber 102c to decrease a pressure in the chamber 102c. The gas exhaust unit 106 may include a vacuum pump such as a turbo-molecular pump and a pressure control device such as a pressure control valve.

When plasma processing is performed by the plasma processing apparatus 100, a processing gas is supplied into the chamber 102c. A pressure in the chamber 102c is decreased by the gas exhaust unit 106. The processing gas supplied into the chamber 102c is excited by a high frequency (e.g., a microwave) introduced from the antenna 108. The antenna 108 is provided, e.g., above the stage 104. The antenna 108 is connected to the output unit 18 of the high frequency generator 10. In one embodiment, the high frequency generator 10 is connected to the antenna 108 without a tuner for impedance matching. The original signal generator 30 is connected to the high frequency generator 10. As described above, the high frequency generator 10 can output a high frequency having a power and a phase having small errors with respect to a desired power and a desired phase from the output unit 18. Therefore, the high frequency power having a power and a phase having small errors with respect to a desired power and a desired phase is supplied to the load of the high frequency generator 10 without using a tuner.

The main control unit 110 may be a computer device. The main control unit 110 may include a processor, a storage device such as a memory, an input device such as a keyboard, a display device, and a signal input/output interface. A control program and a recipe data are stored in the storage device of the main control unit 110. The main control unit 110 controls the respective components of the plasma processing apparatus 100 based on the control program and the recipe data. The main control unit 110 is configured to provide, e.g., a target power $P_t$ and a target phase $\theta_t$ described above to the control unit 22 of the high frequency generator 10.

In one embodiment, the control unit 22 of the high frequency generator 10 determines the level of the in-phase signal $I_S$ and the level of the orthogonal signal $Q_S$ such that a difference between the power of the traveling waves in the output unit 18 which is obtained from the first estimated value $I_{E1}$ and the second estimated value $Q_{E2}$ and the power of the reflected waves in the output unit 18 which is obtained from the third estimated value $I_{ES}$ and the fourth estimated value $Q_{E4}$ becomes equal to or close to the target power $P_t$ at the time when the high frequency generator 10 starts the supply of the high frequency.

Accordingly, in the case of performing the ALD process by the plasma processing apparatus 100, for example, when the supply of the high frequency from the high frequency generator 10 is started for plasma generation, the power of the high frequency is controlled at a high speed such that the power of the high frequency coupled to the load becomes equal to or close to the target power $P_t$.

In the example shown in FIG. 8, the plasma processing apparatus 100 includes a single high frequency generator 10. However, the plasma processing apparatus 100 may include a plurality of high frequency generators 10. The plurality of high frequency generators 10 are arranged in parallel between the original signal generator 30 and the antenna 108. In other words, the high frequency generators 10 are configured to receive high frequency original signals distributed by the original signal generator 30 and supply the generated high frequency to the antenna 108.

While various embodiments have been described, various modifications can be made without being limited to the above embodiments. For example, in a modification, the high frequency generator 10 may generate a high frequency from LF band to VHF band, instead of a microwave. In that case, the high frequency generator 10 includes a detector, instead of the demodulator 24. The detector detects a power and a phase of the first high frequency outputted from the third port 20c of the directional coupler 20 and a power and a phase of the second high frequency outputted from the fourth port 20d of the directional coupler 20. The control unit 22 has a demodulator for obtaining an in-phase component $I_{MF}$ and an orthogonal component $Q_{MF}$ of the first high frequency and an in-phase component $I_{MR}$ and an orthogonal component $Q_{MR}$ of the second high frequency from the power and the phase of the first high frequency which are detected by the detector. The in-phase component $I_{MF}$, the orthogonal component $Q_{MF}$, the in-phase component $I_{MR}$ and the orthogonal component $Q_{MR}$ which are obtained by the demodulator are inputted into the first matrix operation unit 22a.

In the case of generating a high frequency from LF band to VHF band by the high frequency generator 10, the plasma processing apparatus 100 may include a high frequency electrode, instead of the antenna. In that case, the gas in the chamber 102c is excited by the high frequency introduced into the chamber 102c from the high frequency electrode.

While the present disclosure has been shown and described with respect to the embodiments, it will be understood by those skilled in the art that various changes and modifications may be made without departing from the scope of the present disclosure as defined in the following claims.

What is claimed is:

1. A high frequency generator comprising:
   a vector multiplier configured to generate a modulated wave by applying IQ modulation to a high frequency original signal;
   an amplifier configured to generate an amplified high frequency by amplifying the modulated wave and output the amplified high frequency;
   a circulator including a first port, a second port and a third port and configured to receive the amplified high frequency from the amplifier through the first port, allow a high frequency inputted into the first port to be outputted through the second port, and allow a high frequency inputted into the second port to be outputted through the third port;
   an output unit connected to the second port;
   a directional coupler configured to output a first high frequency including a part of traveling waves propagating from the amplifier to the output unit and output a second high frequency including a part of reflected waves returning to the output unit; and
   a control unit configured to determine a level of an in-phase signal and a level of an orthogonal signal that are used for the IQ modulation of the vector multiplier based on an in-phase component and an orthogonal component of the first high frequency and an in-phase component and an orthogonal component of the second high frequency, the control unit comprising:
      a first matrix operation unit configured to obtain a first estimated value of an in-phase component of the traveling waves in the output unit, a second estimated value of an orthogonal component of the traveling waves in the output unit, a third estimated value of an in-phase component of the reflected waves in the output unit, and a fourth estimated value of an orthogonal component of the reflected waves in the output unit by performing a first matrix operation that is an operation of four polynomials, each including as multi-variables the in-phase component and the orthogonal component of the first high frequency and the in-phase component and the orthogonal component of the second high frequency,
      wherein a matrix of coefficients used in the first matrix operation is predetermined such that the first estimated value, the second estimated value, the third estimated value and the fourth estimated value are obtained from the in-phase component and the orthogonal component of the first high frequency and the in-phase component and the orthogonal component of the second high frequency,
      a first conversion unit configured to obtain an estimated power and an estimated phase of a high frequency in the output unit at least from the first estimated value and the second estimated value,
      a feedback control unit configured to obtain a corrected power and a corrected phase such that errors of the estimated power and the estimated phase with respect to a target power and a target phase are reduced,
      a second conversion unit configured to determine a level of the in-phase signal and a level of the orthogonal signal based on the corrected power and the corrected phase.

2. The high frequency generator of claim 1, wherein the first matrix operation includes operations of high-order terms of each of the in-phase component and the orthogonal component of the first high frequency and the in-phase component and the orthogonal component of the second high frequency.

3. The high frequency generator of claim 1, wherein the second conversion unit is further configured to obtain a first in-phase component and a first orthogonal component on an IQ plane that correspond to the corrected power and the corrected phase, and the control unit further comprises a second matrix operation unit configured to obtain a second in-phase component and a second orthogonal component for determining the level of the in-phase signal and the level of the orthogonal component, respectively, by performing a second matrix operation that is an operation of two polynomials, each including as multi-variables the first in-phase component and the first orthogonal component, and wherein a matrix of coefficients used in the second matrix operation is predetermined such that errors of a power and a phase of the high frequency in the output unit reduced.

4. The high frequency generator of claim 3, wherein the second matrix operation includes operations of high-order terms of each of the first in-phase component and the first orthogonal component.

5. The high frequency generator of claim 1, wherein the high frequency outputted from the output unit of the high frequency generator is a microwave, and the high frequency generator further comprises a demodulator configured to generate the in-phase component and the orthogonal component of the first high frequency and the in-phase component and the orthogonal component of the second high frequency by performing IQ demodulation on the first high frequency and the second high frequency.

6. The high frequency generator of claim 1, wherein the control unit is a field programmable gate array or a processor.

7. A plasma processing apparatus comprising:

a chamber main body providing a chamber; and the high frequency generator, described in claim 1, configured to supply a high frequency to excite a gas supplied into the chamber.

8. The plasma processing apparatus of claim 7, wherein the high frequency generator is the high frequency generator 5 described in claim 5, wherein the plasma processing apparatus further comprises an antenna connected to the output unit of the high frequency generator and configured to introduce a high frequency supplied from the high frequency generator into the chamber, and wherein the high frequency generator is connected to the antenna without a tuner for impedance matching.

9. The plasma processing apparatus of claim 7, wherein the control unit of the high frequency generator determines the level of the in-phase signal and the level of the orthogonal signal such that a difference between a power of traveling waves in the output unit which is obtained from the first estimated value and the second estimated value and a power of reflected waves in the output unit which is obtained from the third estimated value and the fourth estimated value, becomes equal to or close to the target power at the time when the high frequency generator starts the supply of the high frequency.

* * * * *